United States Patent [19]

Takemura

[11] 4,320,413
[45] Mar. 16, 1982

[54] SOLID-STATE IMAGE PICK-UP DEVICE

[75] Inventor: Yasuo Takemura, Kawasaki, Japan

[73] Assignee: Tokyo Shibaura Denki Kabushiki Kaisha, Kawasaki, Japan

[21] Appl. No.: 192,475

[22] Filed: Sep. 30, 1980

[30] Foreign Application Priority Data

Sep. 4, 1979 [JP] Japan .................................. 54-127275
May 15, 1980 [JP] Japan .................................. 55-63355
May 15, 1980 [JP] Japan .................................. 55-63356

[51] Int. Cl.³ .............................................. H04N 3/15
[52] U.S. Cl. ..................................... 358/44; 358/213; 357/30
[58] Field of Search ..................... 358/41, 43, 44, 209, 358/213; 357/24, 30; 250/578, 211 J

[56] References Cited

U.S. PATENT DOCUMENTS 4,064,533 12/1977 Lampe ................................ 358/213
4,179,711 12/1979 Nagumo .............................. 358/213

OTHER PUBLICATIONS

CCD-TV Cameras Utilizing Inter-Line-Transfer Area Image Sensors, Hoagland et al., 1975 International Conf. on the Application of Charge Coupled Devices 29–31 Oct. 1975 pp. 173–180.
Color Imaging System Using a Single CCD Area Array, Dillon et al., IEEE Transactions on Electron Devices, vol. ED-25, No. 2, Feb. 1979 Fairchild Semiconductor Components Group, CCD 211, Data Sheet Mar. 1976, pp. 1–6.

Primary Examiner—Michael A. Masinick
Attorney, Agent, or Firm—Oblon, Fisher, Spivak, McClelland & Maier

[57] ABSTRACT

In a solid-state image pick-up device having a plurality of image pick-up portions horizontally arranged, each containing a plurality of photodiodes vertically arranged, the image pick-up portions are arranged alternately at long and short intervals, overflow drains are provided on each short interval each commonly for two image pick-up portions, two transfer portions are provided on each long interval, one end of each transfer portion is connected to a line transfer portion, and the output terminal of the line transfer portion is connected to an interpolation circuit with delay lines.

5 Claims, 27 Drawing Figures

FIG. 4
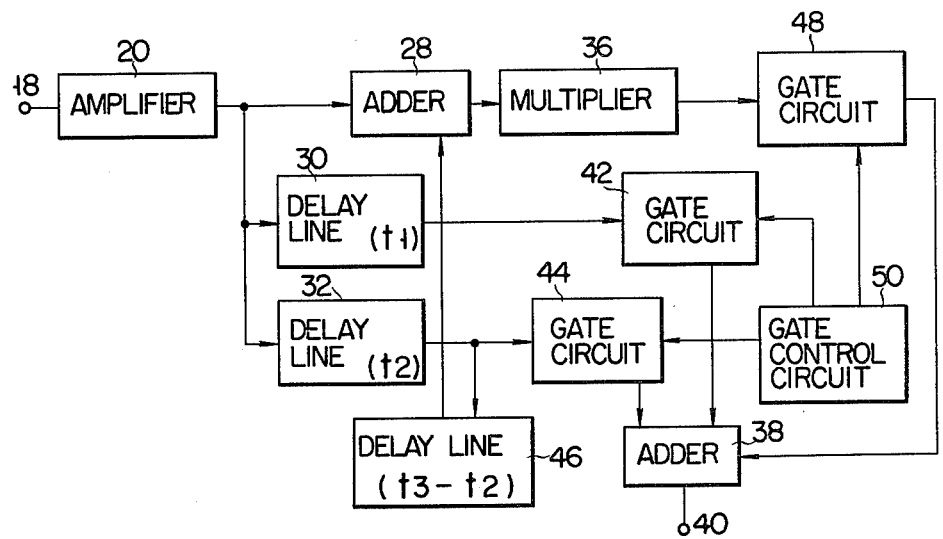
FIG. 5A
FIG. 5B
FIG. 5C
FIG. 5D
FIG. 5E
FIG. 5F

SOLID-STATE IMAGE PICK-UP DEVICE

The present invention relates to a solid-state image pick-up device using an interline type charge transfer device.

Recently, many and various solid-state image pick-up devices using charge transfer device such as charge coupled device (CCD) have been developed. One of the typical examples of the image pick-up devices is the device using the frame transfer type CCD. The image pick-up device is comprised of an image pick-up portion having the CCD arranged two-dimensionally and a storage portion disposed adjacent to the image pick-up portion. In operation, after the optical data are converted into the corresponding electrical data, the data of one frame are transferred to the storage portion in a parallel manner and further transferred to a line transfer portion and then read out from an output terminal of the line transfer portion. In the image pick-up device using the frame transfer type CCD the image pick-up portion is made of the CCD. The sensitivity of the blue component contained in the incident light rays is reduced by being absorbed by the polysilicon electrode formed on the CCD. Further, where the electrode is made of aluminium, the effective light rays of the those incident on the image pick-up device are only those incoming through the gaps between the electrodes, resulting in reduction of the sensitivity of the pick-up device for light rays.

To avoid this problem, there has been provided the solid-state image pick-up device using the interline type CCD in which a photodiode array is used for the image pick-up portions and the CCD is used only for the transfer portions. In the image pick-up device, image pick-up portions each including a number of photodiodes vertically arranged are horizontally disposed with space intervals. The transfer portions made of the CCD vertically disposed are arranged on one sides of the image pick-up portions respectively. On the other sides of image pick-up portions, overflow drains are respectively disposed in a column, which are for preventing a phenomenon, called a blooming phenomenon, that excessive charges produced in the image pick-up portions expand vertically. The overflow drain is disposed adjacent to another transfer portion provided for the adjacent image pick-up portion.

Thus, the image pick-up device using the interline type CCD does not use the CCD for the image pick-up portions. Therefore, the sensitivity reduction for the blue component caused by the polysilicon electrode is prevented. However, this type image pick-up device needs the transfer portions and overflow drains, in addition to the image pick-up portions. The area occupied by the image pick-up portions in the pick-up device is necessarily small, with the result that the efficiency of the light use is poorer. The resolution of the solid-state image pick-up device depends on the number of picture elements (photodiodes) constituting the image pick-up portions. To obtain a clear picture with high resolution, the number of the picture elements must therefore be increased. The minimum size of the picture element depends on the fine working technique, so that the whole number of the picture elements is determined by the area of the image pick-up portions. For this reason, the conventional solid-stage image pick-up device using the interline type CCD has inherent difficulty in increasing the picture elements so that it is difficult to obtain a clear picture with the high resolution.

An object of the invention is to provide a solid-state image pick-up device using an interline type charge transfer device, which may provide a picture with high resolution and have a high sensitivity.

To achieve above object, there is provided a solid-state image pick-up device comprising a plurality of image pick-up portions two-dimensionally arranged with intervals, each including a plurality of photoelectric converting elements arranged in a line; a plurality of overflow drains disposed on every other interval; a plurality of first charge transfer portions which are disposed two for each interval having no overflow drain and each having electrodes corresponding to the photoelectric converting elements of the image pick-up portion adjacent thereto; and a second charge transfer portion connected to one end of each first charge transfer portion.

Other objects and features of the present invention will be apparent from the following description, taken in connection with the accompanying drawings, in which:

FIG. 4 shows a circuit diagram of a second embodiment of the solid-state image pick-up device according to the present invention;

FIGS. 5A to 5F show timing charts useful in explaining the operation of the circuit shown in FIG. 4;

Figure 1:
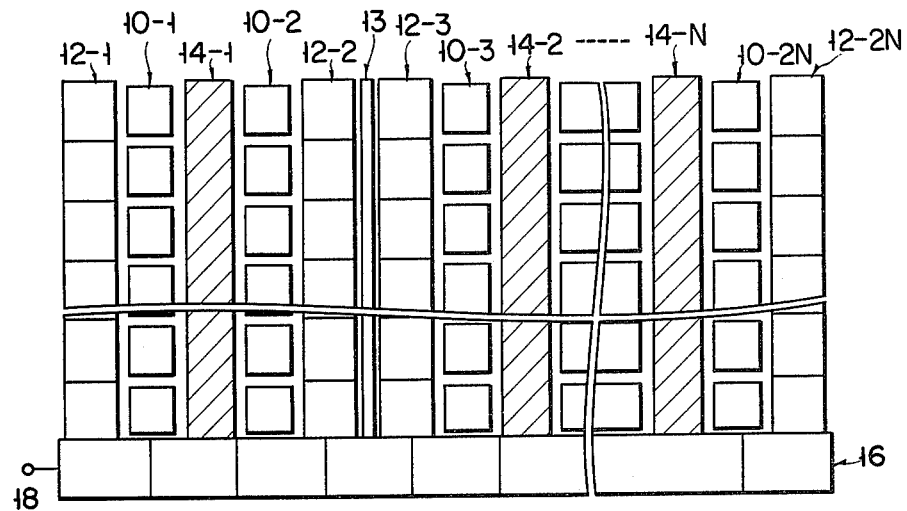
FIG. 1 shows a plan view illustrating the structure of an embodiment of the solid-state image pick-up device according to the present invention.

An embodiment of the solid-state image pick-up device according to the present invention will be described referring to FIGS. 1 to 3. 2N image pick-up portions 10-1, 10-2, ... 10-2N, each including M photodiodes vertically arranged in a column, are arranged two-dimensionally, as shown in FIG. 1. Each photodiode constitutes a picture element which is a square of $15^2$ $\mu$m, in the present embodiment. It is further assumed that M is to be 490 and N is 580 in the present embodiment. Charge transfer portions each made of CCD 12-1, 12-3, ... 12-2N-1, respectively, are disposed on the left sides of the odd numbered image pick-up portions 10-1, 10-3, 10-2N-1, as shown in FIG. 1. Similarly, transfer portions made of CCDs 12-2, 12-4, ... 12-2N, respectively, are disposed on the right sides of the even numbered image pick-up portions 10-2, 10-4, ... 10-2N. Although not shown in the drawing, the electrodes corresponding to the picture elements of the image pick-up portions are equidistantly disposed on the transfer portions 12-1, 12-2, ... 12-2N. Overflow drains 14-1, 14-2, ... 14-N are respectively disposed on the right sides of the odd numbered image pick-up portions 10-1, 10-3, ... 10-2N-1, that is on the left sides of the even numbered image pick-up portions 10-2, 10-4, ... 10-2N. Like the image pick-up portions, the transfer portions and the overflow drains are vertically arranged in columns. The width of each transfer portion, i.e. the distance as viewed horizontally, is 10 μm and the width of each overflow drain is 25 μm. Channel stoppers 13 are provided between the adjacent image pick-up portions, for example, the image pick-up portions 12-2 and 12-3. A line transfer portion 16 made of CCD is horizontally disposed on the lower ends of the image pick-up portions, the transfer portions, and the overflow drains, as viewed in the drawing. The transfer portion 16 is also provided with a plurality of electrodes arranged equidistantly. The lower ends of the transfer portions are alternately connected to the electrodes of the line transfer portion 16. The line transfer portion 16 is driven in a two-phase manner. One end of the line transfer portion 16 is connected to the terminal 18. Although not shown, a clock pulse generating circuit is connected to the electrodes of the transfer portions and the line transfer portion to transfer the charges generated in the photodiodes.

Figure 2:
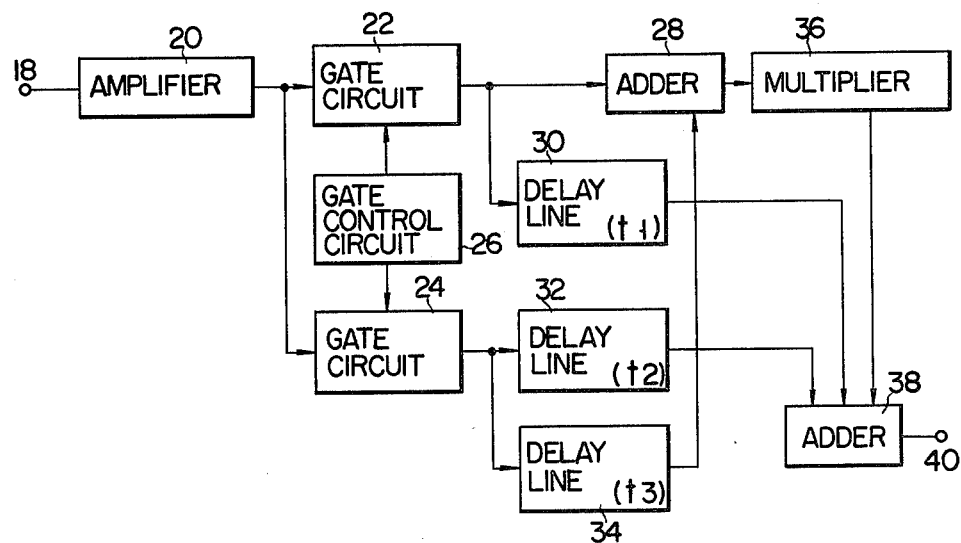
FIG. 2 shows a circuit diagram of the image pick-up device shown in FIG. 1.

Turning now to FIG. 2, there is shown a circuit diagram of an output circuit of the solid-state image pick-up device shown in FIG. 1. The terminal 18 shown in FIG. 1 is connected to the input terminals of first and second gate circuits 22 and 24, through an amplifier 20. A first control signal from a gate control circuit 26 is supplied to the control terminal of the first gate circuit 22. A second control signal therefrom is supplied to the control terminal of the second gate circuit 24. The output terminal of the first gate circuit 22 is connected to one input terminal of an adder 28 and to the input terminal of a first delay line 30 providing a delay time t1. The output terminal of the second gate circuit 24 is connected to the input terminals of second and third delay lines 32 and 34 respectively providing delay times t2 and t3. The output terminal of the third delay line 34 is connected to the other input terminal of the adder 28. The output terminal of the adder 28 is connected to the first input terminal of an adder 38, via a multiplier 36. The output terminals of the first and second delay lines 30 and 32 are connected to the second and third input terminals of the adder 38, respectively. The output terminal 40 of the adder 38 serves as an output terminal of the solid state image pick-up device.

Figure 3A:
FIGS. 3A to 3H show time charts of assistance in explaining the operation of the circuit shown in FIG. 1.

The operation of the embodiment as mentioned above will be described. The charges generated in the respective photodiodes triggered by the light rays incident upon the image pick-up portion 10-1, are simultaneously transferred to the respective electrode sections of the adjacent transfer portion 12-1 during the vertical blanking period. The charges transferred are successively transferred downwardly to the line transfer portion 16 by applying given pulse signals to the respective electrodes of the transfer portion 12-1. This operation is also concurrently performed in the combinations of the remaining image pick-up portions 10-2, 10-3, . . . 10-2N and the remaining transfer portions 12-2, 12-4, . . . 12-2N. Therefore, when the charges are transferred downwardly in the transfer portions, those are transferred in parallel through all the transfer portions 12-1, 12-2, . . . 12-2N. While the charges are transferred in the transfer portions, the image pick-up portions 10-1, 10-2, . . . 10-2N are ready for storing the charges generated by the next incident light. The line transfer portion 16 arranges the charges delivered from the respective transfer portions 12-1, 12-2, . . . 12-2N into a serial form and sequentially transfers them to the terminal 18. In this way, a video signal as shown in FIG. 3A is obtained from the terminal 18.

The overflow drains disposed between the adjacent image pick-up portions absorb excessive charges overflown from the image pick-up portions when the amount of the incident light is excessive, thereby to prevent the blooming phenomenon. The channel stopper 13 provided between the transfer portions prevent the signal in one transfer portion from mixing with the signal or the signals in the adjacent transfer portion or portions.

As seen from the foregoing, the overflow drains are not provided for the respective image pick-up portions in one-to-one relation, but one overflow drain is provided for two image pick-up portions. Therefore, the area occupied by the overflow drains is small, so that the area occupied by the image pick-up portions is larger to that extent. This realizes a solid-state image pick-up device with the improved efficiency of the light use and the improved sensitivity thereby to provide a picture with high resolution. With the above-mentioned dimensions of the widths of the respective portions, the efficiency of the light use (the ratio of the area of the image pick-up portions to the whole area of the image pick-up device) was 30% in the conventional image pick-up device using the overflow drains provided for the respective image pick-up portions. On the other hand, it is improved to 40% in the pick-up device of the present invention with one overflow drain for two image pick-up portions.

As shown in FIG. 1, the intervals between the adjacent image pick-up portions as viewed horizontally are not equal but long and short intervals are alternately disposed. However, since the intervals between the electrodes of the line transfer portion 16 are equal to each other, the picture components of a signal appearing on the output terminal 18 have uniform periods, as shown in FIG. 3A, and the positions of actual picture elements are shifted from the picture components of the video signal. In this respect, the reproduced picture is distorted. In photographing an ordinary object, the distortion is negligible. If the positions of actual picture components coincides with those of the signal produced from the terminal 18, the quality of the reproduced picture is improved. To obtain this position relation the intervals between the electrodes of the line transfer portion 16 become unequal. But this brings the following disadvantage. In this case, the number of the electrodes is large, then the manufacturing of the electrodes becomes difficult.

Therefore, the manufacturing of the electrodes in the short intervals becomes difficult. Further, it is wasteful to prepare the electrodes on the section corresponding to the element which does not transfer the signal.

Figure 3B:

Therefore, to change the signal (FIG. 3A) appearing on the terminal 18 so as to coincide with the actual picture elements in the position relation is employed. Signal components of a signal corresponding to the intervals between the actual image pick-up portions have alternate long and short periods. Assume now that the sum of the two long and short periods of the signal components is equal to the sum of the two periods of the signal components shown in FIG. 3A. The actual signal is shown in FIG. 3B. Assuming that the period of the signal shown in FIG. 3A is T, the short and long periods shown in FIG. 3B are T1 and T2, T1+T2=2T. The odd numbered signal components of both the signals appear at the same timing, while the even numbered signal components thereof are such that the signal shown in FIG. 3B appears T−T1 earlier than the signal shown in FIG. 3A. The signal shown in FIG. 3A is applied to the first and second gate circuits 22 and 24, through the amplifier 20. The gate control circuit 26 synchronizes with the signal shown in FIG. 3A to render the gate circuits 22 and 24 every T, supplies the first control signal to the control terminal of the first gate circuit 22 at the timing of 2T−1, and supplies the second control signal to the control terminal of the second gate circuit 24 at the timing 2T. Therefore, the output signal of the first gate circuit 22 is composed of only the video component of the odd numbered video signal shown in FIG. 3A. The output signal of the second gate circuit 24 is composed of only the video component of the even numbered video signal shown in FIG. 3A. Assume again that the delay times t1, t2 and t3 of the delay lines 30, 32 and 34 are related by $$t2 = t1 + T1 - T \quad (1)$$

and $$t3 = t1 + T1/2 \quad (2).$$

Figure 3C:
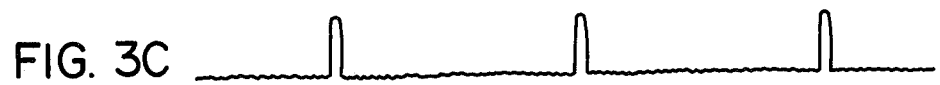
Figure 3D:
Figure 3E:
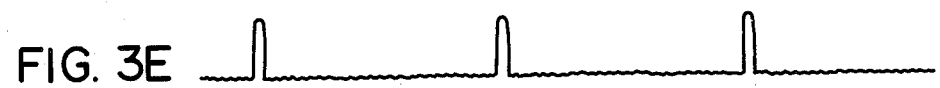

The output signal from the first gate circuit 22 is supplied to the first delay line 30, so that the signal as shown in FIG. 3C is produced from the first delay line 30. The output signal from the second gate circuit 24 is supplied to the second and third delay circuits 32 and 34, so that the signals as shown in FIGS. 3D and 3E are produced from the second and third delay lines 32 and 34, respectively.

Figure 3F:

The signal components of the signal shown in FIG. 3C advances by T−t1 with the respect to the even numbered components of the signal shown in FIG. 3A. The signal components of the signal shown in FIG. 3D retards by t2 behind the even numbered components of the signal shown in FIG. 3A. When both the signals are added as shown in FIG. 3F, the periods of the signal components are T−t1+t2 and T−t2+t1. Substituting the equations (1) and (2) into the above formulae, we have $$T - t1 + t1 + T1 - T = T1$$

$$T - (t1 + T1 - T) + t1 = 2T - T1 = T2$$

Accordingly, the signal as shown in FIG. 3F with the same period as that of the signal shown in FIG. 3B is obtained.

Figure 3G:

In this signal, however, no signal component is present during the long period T2. Because of this, another signal component is interpolated during this period. The signal components present during the period T2 are the odd signal component of the signal shown in FIG. 3A and the signal component shown in FIG. 3E. Hence, both the signals are added by the adder 28 and it is proportionally allotted by the multiplier 36 thereby to calculate the value of the signal component in the midpoint during the period T2 as shown in FIG. 3G. For simplicity, assume that T1=2T/3, T2=2T1=4T/3, t1=2t2=T1, t2=T/3 and t3=3t2=T. Accordingly, the signal shown in FIG. 3E contains only the odd numbered components of the signal shown in FIG. 3A. The multiplier 36 merely multiplies the output signal from the adder 28 by ½.

Figure 3H:

The signals shown in FIGS. 3F and 3G are applied to the adder 38 which in turn produces at the output terminal 40 a signal having equidistantly arranged signal components, as shown in FIG. 3H. Through this interpolation, a signal component is produced at the location having no image pick-up portion, thus resulting in the picture with high resolution.

The relation between the period of the signal from the actual image pick-up portion and that of the signal from the terminal 18 is not limited to the above-mentioned one. When the above-mentioned periodical relation is insufficiently satisfied, the periods of the signal components of the signal as the result of the interpolation, as shown in FIG. 3H, are not accurately uniform. Compared to the signal shown in FIG. 3F, those periods are more uniform and the distortion of the reproduced picture is negligible or invisible to the naked eye.

The second embodiment of the solid-state image pick-up device according to the present invention will be described. Like reference numerals are used for designating like portions in the first embodiment. Assume that the structure of the pick-up device is the same as that of the first embodiment. The circuit diagram of the output circuit of the device is shown in FIG. 4. Further, the periods of the signals and the delay times of the delay lines are the same structure as those corresponding ones of the first embodiment. A terminal 18 is coupled with one input terminal of an adder 28 and input terminals of first and second delay lines 30 and 32, through an amplifier 20. The output signal of the first delay line 30 is applied to the first input terminal of an adder 38 through a first gate circuit 42. The output signal of the second delay line 32 is applied to a second input terminal of the adder 38 through a second gate circuit 44, and at the same time is applied to the other input terminal of the adder 28 through the third delay line 46 with a delay time t3−t2. The output signal of the adder 28 is applied to the third input terminal of the adder 38 through a multiplier 36 and a third gate circuit 48. The first to third control signals of the gate control circuit 50 are applied to the control terminals of the first to third gate circuits 42, 44 and 48, respectively.

The operation of the circuit will be described referring to signal waveform diagrams at the respective positions shown in FIGS. 5A to 5F. A signal as shown in FIG. 5A is delivered from the terminal 18, as in the first embodiment. The signal is delayed by t1 and t2 through the first and second delay lines 30 and 32 to produce signals as shown in FIGS. 5B and 5C. Further, a signal as shown in FIG. 5C is delayed by t3−t2 through the third delay line 46 to produce a signal shown in FIG. 5D which is the signal shown in FIG. 5A delayed by t3. This signal and the original signal (FIG. 5A) are averaged by the combination of the adder 28 and the multiplier 36 of a multiplier ½ thereby to form a signal as shown in FIG. 5E. By adding the output signals (FIGS. 5B and 5C) of the first and second delay lines 30 and 32 to the output signal (FIG. 5E) of the multiplier 36, an equidistantly interpolated signal is obtained. Since the output signals of the first and second delay lines are formed by delaying the same signal (FIG. 5A), those are used by sampling them every other signal. In order to arrange the signal components equidistantly, the signals shown in FIG. 5E are also sampled every other signal. To this end, the gate control circuit 50 supplies control signals to the respective gate circuits so that the gate circuits allows the signal components to pass therethrough every other signal. The respective gates conduct in the order of third, second and first gate circuits 48, 44 and 42. The circuit arrangement as mentioned above attains the effects similar to those of the first embodiment.

Figure 6:
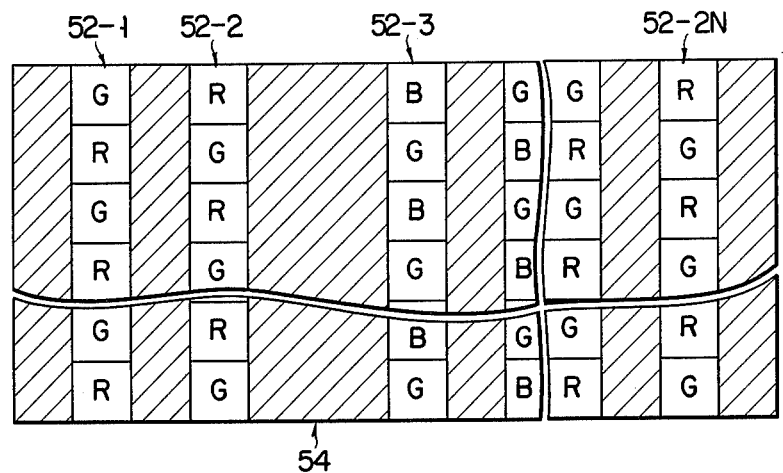
FIG. 6 illustrates a color filter array according to a third embodiment according to the present invention.
Figure 7:
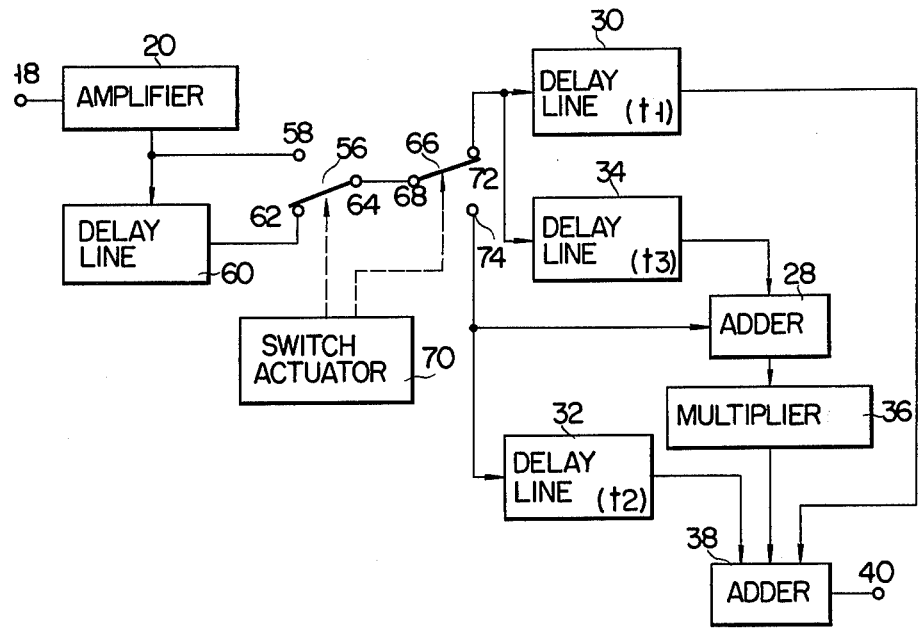
FIG. 7 shows a circuit diagram of the third embodiment according to the present invention.

A third embodiment of the solid-state image pick-up device will be described. The third embodiment is designed especially for the color image pick-up. Three color signals are obtained by light rays coming through a filter array with red, green and blue color filters. The filter array is constructed as shown in FIG. 6. As shown, color filter portions 52-1, 52-2, . . . 52-2N are disposed at the portions corresponding to the image pick-up portions, while opaque portions 54 are disposed at the remaining portions. In connection with the color filter portion, the green filters G allowing green color to pass therethrough, which most influences the resolution, are used more than the remaining filters, that is, red and blue filters R and B. When light rays reach the image pick-up device as shown in FIG. 1, through the filter array thus constructed, the respective color signals corresponding to the respective color filters successively appear at the terminal 18. FIG. 7 shows a circuit diagram of the output circuit of the third embodiment.

The terminal 18 is connected to a first movable contact 58 of a switch 56 via an amplifier 20 and to a second movable contact 62 of the switch 56 through the amplifier 20 and a delay line 60. The delay time of the delay line 60 is equal to a horizontal scanning time of the image pick-up device. A fixed contact 64 of the switch 56 is connected to a fixed contact 68 of a switch 66. The switches 56 and 66 are switched by a switch actuator 70. A first movable contact 72 of the switch 66 is connected to the first input terminal of an adder 38 via a first delay line 30 and to one input terminal of an adder 28 via a third delay line 34. A second movable contact 74 of the switch 66 is connected to the other input terminal of the adder 28 and to the second input terminal of the adder 38 via a second delay line 32. The output terminal of the adder 28 is connected to a third input terminal of the adder 38 through a multiplier 36.

Figure 8A:
FIGS. 8A to 8H show timing charts useful in explaining the operation of the circuit shown in FIG. 7.
Figure 8B:
Figure 8C:
Figure 8D:
Figure 8E:
Figure 8F:
Figure 8G:
Figure 8H:

The operation of the circuit will be described. In the description, only a green signal of three color signals will be used, because the description of the green signal is correspondingly applied to the remaining ones. As seen from FIG. 6, in the color filter array, the green signal component appears in a two ways. To be more specific, signals shown in FIGS. 8A and 8B alternately appear every horizontal scanning line at the terminal 18. When the horizontal scanning lines are numbered 1, 2, . . . M from top to bottom, the odd numbered horizontal scanning lines provide signals as shown in FIG. 8A while the even numbered horizontal scanning lines provide signals as shown in FIG. 8B. The odd numbered signal and the even numbered signal are together subjected to the signal interpolation process. When the second scanning line signal (FIG. 8B) appears at the terminal 18, the first scanning signal (FIG. 8A) is produced from the delay line 60. Assume that the short time interval is expressed by T (which is assumed to be the same as T in FIG. 3A), the long time interval is 3T. The switch actuator 70 actuates the switch 56 every 3T, so that all the signal components shown in FIGS. 8A and 8B are passed therethrough and a signal at the time interval T, as shown in FIG. 8C, appears at the fixed contact 64 of the switch 56. The switch 66 is switched by the switch actuator 70 every T, so that the signal components of the signal shown in FIG. 8C is classified into the odd numbered signal components and the even numbered signal components and the even numbered signal components are applied to the first movable contact 72 and the odd numbered signal components to the second movable contact 74. The even numbered signal components are delayed t1 and t3 by the first and third delay lines 30 and 34, respectively, are transformed into signals as shown in FIGS. 8D and 8E. Here, t3 = T and t1 = T/3. The signal shown in FIG. 8E is composed of the odd numbered signal components shown in FIG. 8C. The odd numbered signal components of the signal shown in FIG. 8C are delayed t2 by the second delay line 32 to produce a signal shown in FIG. 8F. Here, t2 = 2T/3. By summing the signal of FIG. 8F and the signal of FIG. 8D, the intervals of the signal components are alternately 2T/3 and 4T/3 and its periodical pattern is an almost perfect simulation of an interval pattern of the actual image pick-up portions. When using a signal (FIG. 8G) resulting from averaging the signal components of FIG. 8E and the odd numbered signal components of the signal of FIG. 8C by the combination of the adder 28 and the multiplier 36, a signal with signal components equidistantly arranged, as shown in FIG. 8H, is formed.

As described above, the present invention increases the area of the image pick-up portion and the number of the picture elements within the pick-up device to improve the resolution of the picture picked up. Even with the fixed period of the drive pulse signal to the line transfer portion, the video signal obtained contains the information of the accurate space intervals of the actual image pick-up portions. This feature ensures good linearity of the reproduced image. The interpolation of the video signal provides a higher resolution picture.

It should be understood that the present invention is not limited to the above-mentioned embodiments. In FIG. 1, by properly selecting the width of the image pick-up portions, transfer portions and the overflow drains, the intervals of the image pick-up portions may be equidistant. Where the number of the picture elements is large, the distortion of the reproduced picture is imperceptible to the naked eye in an ordinary image pick-up so that the output circuit as shown in FIGS. 2, 4 or 7 is unnecessary.

What is claimed is:
1. A solid-state image pick-up device comprising:
a plurality of image pick-up portions two-dimensionally arranged with intervals, each including a plurality of photoelectric converting elements arranged in a line;
a plurality of overflow drains disposed on every other interval to absorb excessive charges overflown from said image pick-up portions;
a plurality of charge transfer portions which are disposed two for each interval having no overflow drain and each having electrodes corresponding to the photoelectric converting elements of said image pick-up portion adjacent thereto to serially transfer charges parallel transferred from said image pick-up portions; and
a second charge transfer portion connected to one end of each said first charge transfer portion to serially transfer charges parallel transferred from said first charge transfer portions.
2. A solid-state image pick-up device according to claim 1, in which said image pick-up portions are alternately arranged with first intervals and second intervals longer than the first intervals, said photoelectric converting elements are arranged equidistantly in said image pick-up portion, said first charge transfer portions are provided two for each second interval, a chan- nel stopper is provided between said two first charge transfer portions, electrodes of said second charge transfer portion are equidistantly arranged at third intervals, and the portions corresponding to the alternate electrodes are connected to one ends of said first charge transfer portion.

3. A solid-state image pick-up device according to claim 2, in which the information photoelectric converted by said image pick-up portions are simultaneously transferred to said first transfer portions which inturn are successively transferred to said second transfer portion at the same time throughout said first charge transfer portions.

4. A solid-state image pick-up device according to claim 1, further comprising delay means connected to the output terminal of said second charge transfer portions for converting an output signal from said second charge transfer portion containing signal components appearing at said third interval into a signal containing signal components alternately appearing at said first and second intervals and signal components appearing at the timing at a midpoint between said second interval.

5. A solid-state image pick-up device according to claim 4, in which said delay means is comprised of switch means connected to the output terminal of said second charge transfer portion, which has first and second output terminals and supplies the signal components of the output signal from said second charge transfer portion alternately to said first and second terminals, a first delay line connected to the first output terminal of said switch means, which has a first delay time and produces signal components corresponding to the signal components appearing at said second interval, a second delay line connected to the second output terminal of said switch means, which has a second delay time and produces signal components corresponding to the signal components appearing at said first interval, a third delay line connected to the second output terminal of said switch means, which has a third delay time longer than said second delay time but shorter than the time till the next signal component appears at said second output terminal, and an averaging circuit connected to said first output terminal of said switch means and said third delay line, which averages both the signal components and produces signal components corresponding to the signal components appearing at the midpoint timing of said second interval.

* * * * *

UNITED STATES PATENT AND TRADEMARK OFFICE
CERTIFICATE OF CORRECTION

PATENT NO. : 4,320,413
DATED : Mar. 16, 1982
INVENTOR(S) : Yasuo Takemura

It is certified that error appears in the above—identified patent and that said Letters Patent is hereby corrected as shown below:

Please correct the Priority Data to read as follows:

[30]---Foreign Application Priority Data

Oct. 4, 1979 [JP] Japan ............ 54-127275

May 15, 1980 [JP] Japan ............ 55-63355

May 15, 1980 [JP] Japan ............ 55-63356

Signed and Sealed this

Eighteenth Day of May 1982

[SEAL]

Attest:

GERALD J. MOSSINGHOFF
Commissioner of Patents and Trademarks

Attesting Officer